United States Patent [19]
Yasuda et al.

[11] Patent Number: 5,989,341
[45] Date of Patent: Nov. 23, 1999

[54] SINGLE CRYSTAL PRODUCING APPARATUS AND A SINGLE CRYSTAL PRODUCING METHOD USING SAME

[75] Inventors: Munehiro Yasuda, Amagasaki; Shinichi Sakurada, Kobe, both of Japan

[73] Assignee: Sumitomo Sitix Corporation, Amagasaki, Japan

[21] Appl. No.: 08/930,572

[22] PCT Filed: Feb. 7, 1997

[86] PCT No.: PCT/JP97/00309

§ 371 Date: Oct. 7, 1997

§ 102(e) Date: Oct. 7, 1997

[87] PCT Pub. No.: WO97/29224

PCT Pub. Date: Aug. 14, 1997

[30] Foreign Application Priority Data

Feb. 8, 1996 [JP] Japan ...................................... 8-047978

[51] Int. Cl.⁶ ..................................................... C30B 35/00
[52] U.S. Cl. .......................... 117/216; 117/208; 117/217; 117/222
[58] Field of Search ..................................... 117/200, 208, 117/213, 216, 217, 218, 222, 900

[56] References Cited

U.S. PATENT DOCUMENTS

| | | | |
|---|---|---|---|
| 5,707,447 | 1/1998 | Schulman et al. | 117/217 |
| 5,746,824 | 5/1998 | Nemetz | 117/13 |
| 5,846,322 | 12/1998 | Schulmann et al. | 117/216 |

*Primary Examiner*—Felisa Hiteshew
*Attorney, Agent, or Firm*—Oblon, Spivak, McClelland, Maier & Neustadt, P.C.

[57] ABSTRACT

A single crystal producing apparatus to be used for raising the single crystals by a CZ method. A cylindrical portion of a main chamber of the single crystal producing apparatus can be separated from the apparatus. Hot zone components can be retained within the cylindrical portion. After the pulling up operation, the cylindrical portion is separated from the apparatus with the hot zone components being engaged with within the cylindrical portion and is carried to another chamber. In another chamber, an overhauling, reproducing and assembling operations of the hot components can be conducted. In the single crystal producing apparatus, a cylindrical portion which goes through an assembling operation of the hot zone components in another chamber is engaged with the apparatus, and the next pulling up operation is conducted. Time required to the next pulling up operation is shortened. The dust amount within the pulling up chamber is reduced.

20 Claims, 5 Drawing Sheets

SINGLE CRYSTAL PRODUCING APPARATUS AND A SINGLE CRYSTAL PRODUCING METHOD USING SAME

BACKGROUND OF THE INVENTION

1. Field of the Invention

The present invention relates to a single crystal producing apparatus to be used for raising single crystals by a CZ method and a single crystal producing method using the same.

2. Discussion of the Background

A single crystal producing apparatus to be used for raising single crystals by a CZ method comprises a main chamber and a pull chamber coupled onto the main chamber. The main chamber is a cylindrical metallic vessel capable of closing the bottom face and opening, closing the top face. Conventionally the metallic vessel is fixed onto the floor face. Within the main chamber is constructed a hot zone. As hot zone components, a crucible, a cylindrical heater to be placed on the external side of the crucible, an adiabatic material to be placed under and around the heater.

In the pulling up the single crystals, a pull chamber is separated from a main chamber and hot zone components are set within a main chamber in a condition where a cover portion for closing the top face of the main chamber is disengaged. Then, the cover portion is engaged and the pull chamber is coupled, so as to start producing single crystals.

In the pulling up operation of the single crystals, a raw material within the crucible is heated and melted. The single crystals are pulled up from the molten liquid within the crucible with a wire hanging from the upper portion of a pull chamber. The pulled single crystals are drawn into the pull chamber. After the pulling up operation of the single crystals are completed, the cooling operation of the apparatus is allowed to wait. The pull chamber is separated and the single crystals accommodated within the pull chamber are taken out. The cover portion is disengaged from and the hot zone components within the main chamber are overhauled. After the reproducing operation (cleaning and exchanging operations), the components are assembled again to prepare for the pulling up of the next single crystals.

In such a single crystal producing apparatus, a cooling operation of the apparatus is allowed to wait after the completion of the pulling up operation of the single crystals. The "chamber decomposition", overhauling, reproducing and assembling and "chamber assembling" operations are conducted in order. Since the next pulling up operation cannot be conducted before the steps are completed, the availability of the apparatus is extremely low. Time required to the next pulling up start including the cooling operation of the apparatus is 10 hours.

In the producing operation of the single crystals, a clean environment is required. Thus, a single crystal producing apparatus is set in a clean pulling up chamber. Dust amount within the pulling up chamber increases through the overhauling, reproducing and assembling operations of the hot zone components, thereby causing risks of lowering the quality of the single crystals.

SUMMARY OF THE INVENTION

An object of the invention is to provide a single crystal producing apparatus and a single crystal producing method capable of improving the availability and reducing the dust amount by pulling up the majority of the overhauling, reproducing and assembling of the hot zone components outside of the chamber.

In a single crystal producing apparatus according to this invention, used to raise single crystals by a CZ method, which produces a raw material molten liquid by a hot zone placed within the main chamber, and draws in the single crystals to be pulled up from the raw material molten liquid within a pull chamber coupled above the main chamber, at least a cylindrical portion of the main chamber is made detachable from the apparatus and at least one type of the hot zone components can be retainable on the indoor side of the cylindrical portion.

The hot zone components are parts placed on the inner side of the cylindrical portion of the main chamber for thermally contributing towards production of the raw material molten liquid. Concretely, a crucible, a heater to be placed on the outside of the crucible, an adiabatic material to be placed on the outside of the heater, and a thermal radiator to be placed above the crucible can be provided.

In the single crystal producing apparatus of this invention, at least one of the hot zone components can be retained on the inner side of the cylindrical portion of the main chamber. It is desired for components as many as possible to be retained. Concretely, the heater and adiabatic material are desired to be retained, and the thermal radiator can be desired to be retained when used. A crucible as well as the components can be further desirably retained.

At least a cylindrical portion of the main chamber is adapted to be ascended, fallen and turned within an apparatus, and the cylindrical portion is desired to be separated from the ascending, falling and turning drive mechanism. Thus, the cylindrical portion becomes easier to be disengaged from the apparatus and engaged with the apparatus.

The cylindrical portion of the main chamber can be disengaged from the apparatus and the hot zone components can be retained on the inner side of the cylindrical portion. Without waiting for the apparatus to be cooled after the completion for the single crystals to be raised, the cylindrical portion of the main chamber is disengaged from the apparatus so that the cylindrical portion together with the hot zone components can be carried externally of the apparatus. Thus, the overhauling, cleaning and assembling operations of the hot zone components can be conducted with efficiency without the apparatus being cooled. Since these operations can be conducted externally of the apparatus, bad influences due to dust can be avoided. Another cylindrical portion which went through the overhauling, cleaning, and assembling operations of the hot zone components can be mounted on the apparatus. The next single crystal raising operation can be conducted. Thus, the availability of the apparatus can be further improved.

A portion except for the cylindrical portion of the main chamber, mamely, a cover portion, of the cover portion and the bottom portion is detachably desired to the cylindrical portion as before for easy mounting and disengaging operations of the hot zone components to be retained within the cylindrical portion. For easy disengaging operation of the cylindrical portion from the apparatus, the bottom portion is desired to be fixed within the apparatus, separated from the cylindrical portion.

The single crystal producing method, for using the aforementioned single crystal producing apparatus according to this invention comprises the steps of disengaging the cylindrical portion of the main chamber after the raising operation of the single crystals, carrying it externally of the apparatus, conducting externally of the apparatus the overhauling, cleaning, assembling operations of the hot zone components retained on the inner side of the cylindrical portion, mounting on the apparatus another cylindrical portion which goes through the overhauling, cleaning and assembling operations of the hot zone components externally the apparatus so as to start the next single crystal raising operation, and improving the availability of the apparatus and reducing the dust amount in the apparatus setting position.

As an external location of the apparatus is desired to be another chamber separated from the pulling up chamber where an apparatus is set up.

DETAILED DESCRIPTION OF THE PREFERRED EMBODIMENTS

The embodiments of this invention will be described hereinafter referring to drawings.

Figure 1:
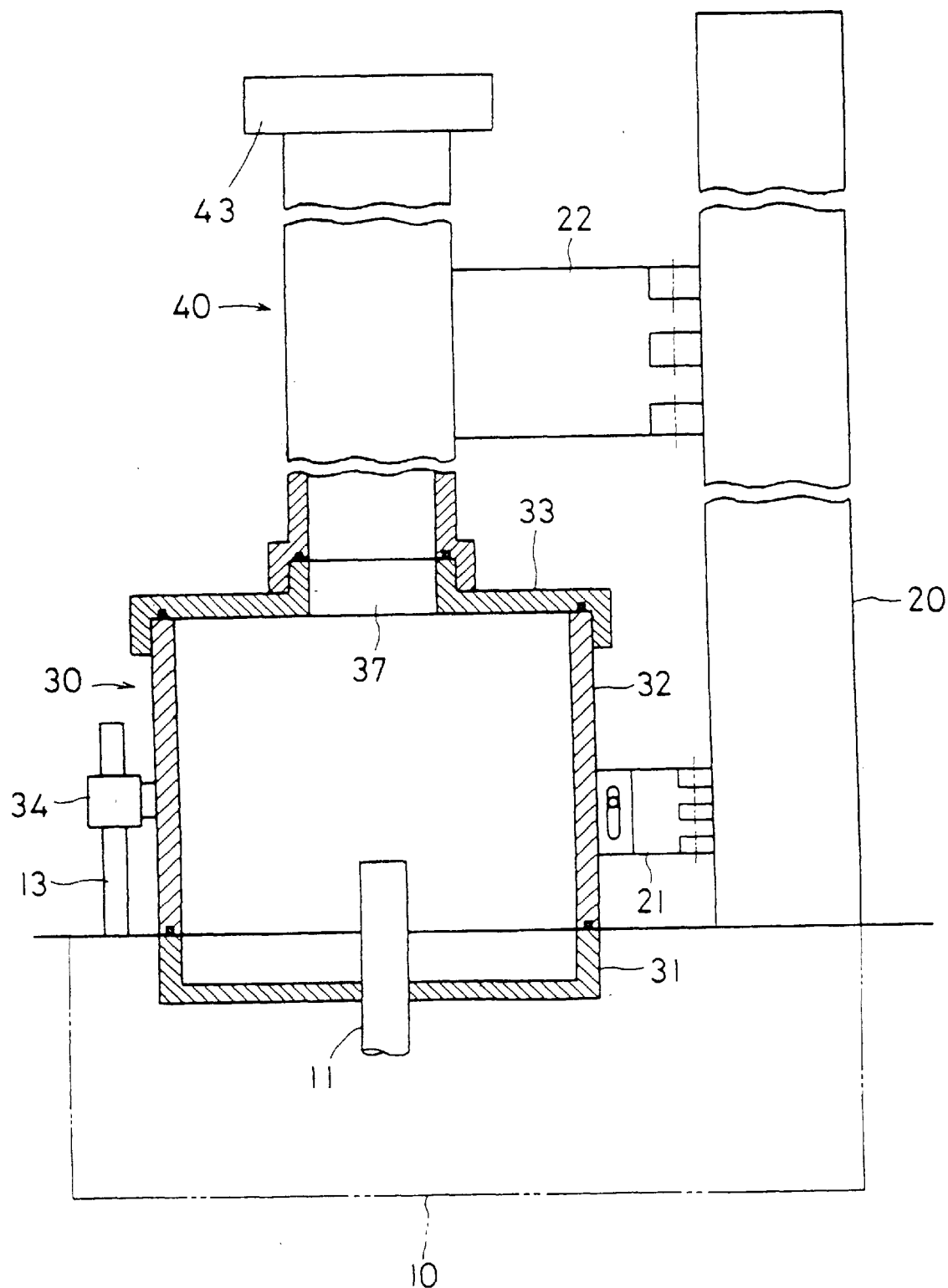
FIG. 1 is a schematic side view showing the whole configuration about one example of a single crystal producing apparatus according to the invention.
Figure 2:
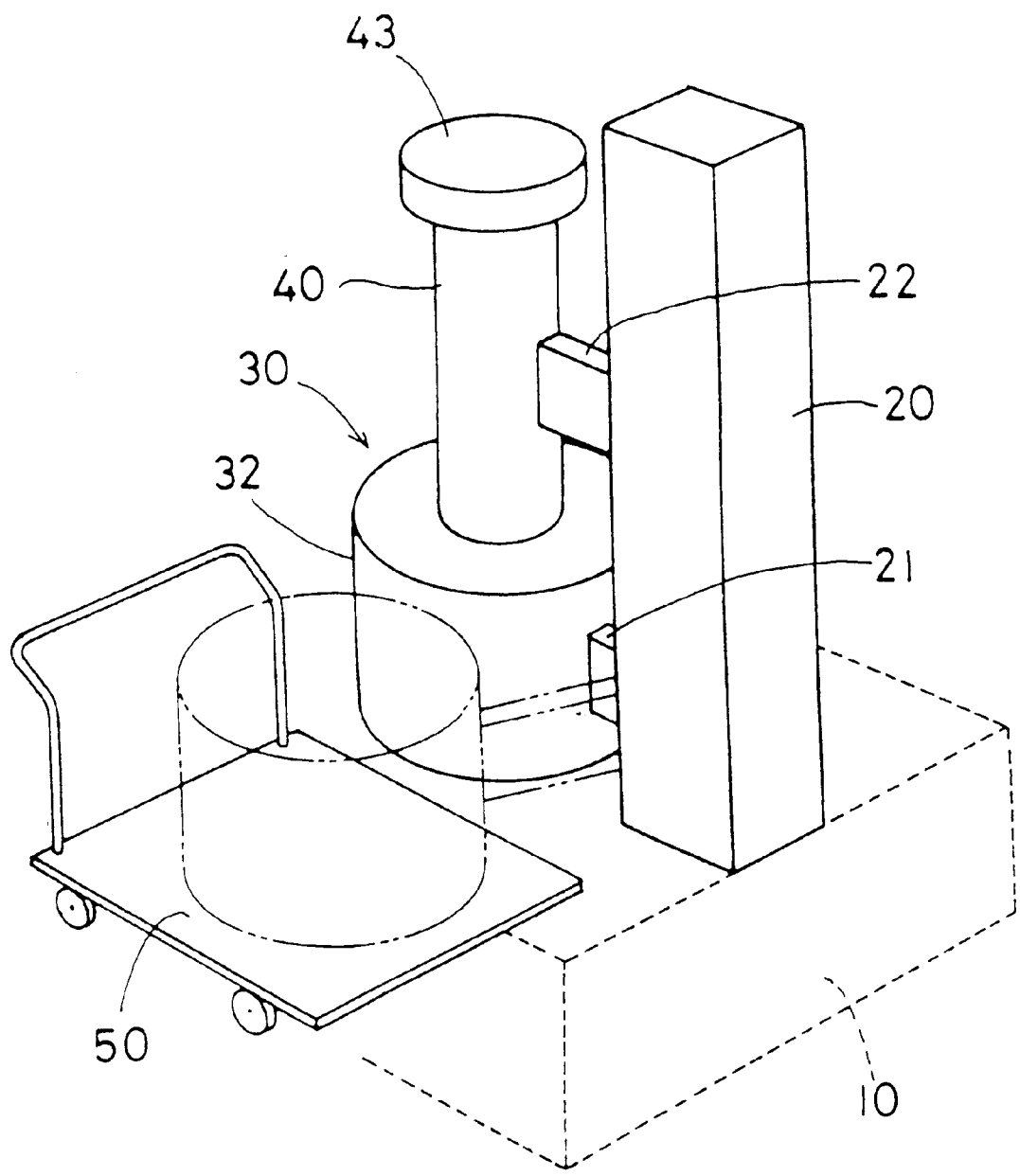
FIG. 2 is a perspective view showing the whole configuration and a using method thereof.

FIGS. 1 through 4 show a first embodiment of the invention. A single crystal producing apparatus according to a first embodiment comprises, as shown in FIGS. 1 and 2, a floor bottom portion 10 buried under an operation floor, a post portion 20 projected above from the rearmost portion of the floor bottom portion 10, a main chamber 30 provided on the floor bottom portion 10 and a pull chamber 40.

The main chamber 30 has a bottom portion 31, a cylindrical portion 32 and a cover portion 33 sequentially piled up. The floor portion 31 is fixed under the operation floor ad is integrated with the floor bottom portion 10. A crucial supporting shaft 11 provided in the floor bottom portion 10 is projected into the main chamber 30 through the central portion of the bottom portion 31. A pair of power terminals for feeding to the heater is projected above the floor bottom portion 10. As described later, the power terminals are positioned externally of the main chamber 30, because the terminals are connected with a pair of heater terminals projected onto the both the sides of the cylindrical portion 32.

The cylindrical portion 32 of the main chamber 30 is placed on the bottom portion 31, and a sealing operation with respect to the bottom portion 31 is conducted with an O ring engaged with the lower end face of the cylindrical portion 32. The cylindrical portion 32 is detachably coupled to the tip end of the ascending, falling and turning arm 21 projected forwards from the front face of the post portion 20.

Figure 3:
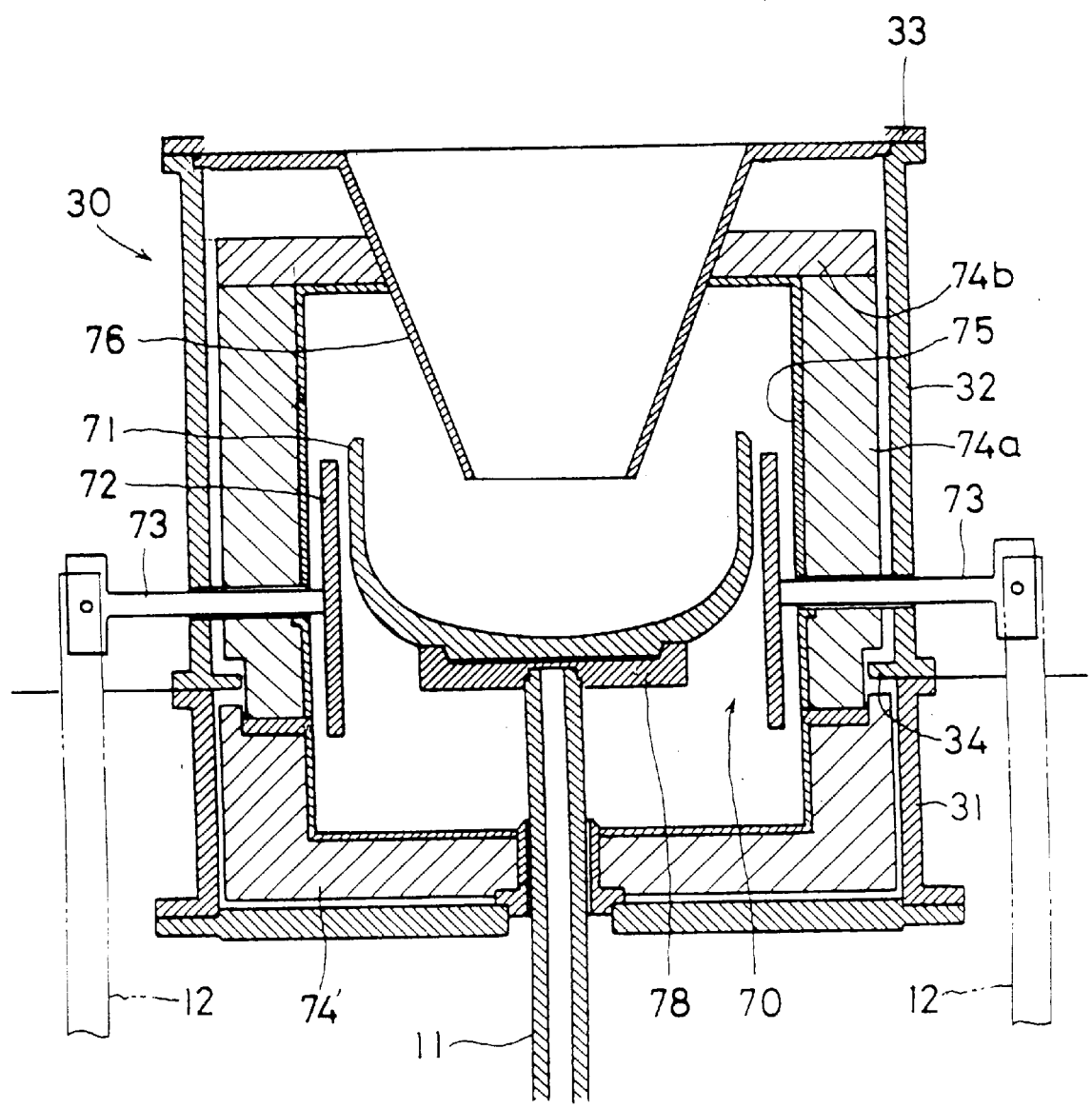
FIG. 3 is a longitudinally sectional view showing an internal configuration of a main chamber.

On the inner side of the cylindrical portion 32, as shown in FIG. 3, is retained detachably various types of hot zone components 70 including a heater 72. A cylindrically-shaped heater 72 surrounding a crucible 71 is retained on the inner side of the cylindrical portion 32 by a pair of heater terminals 73 and 73 on both the sides for working support rods. The heater terminals 73 and 73 are projected externally through the cylindrical portion 32 and are connected with a pair of power terminals 12 and 12 on both the sides provided externally of the main chamber 30. The heater terminals 73 and 73 are detachable with respect to the power terminals 12 and 12 to engage with and disengage from the heater 72.

On the outside of the heater 72 are arranged various cylindrically-shaped adiabatic materials 74 (74a and 74b) along the inner face of the cylindrical portion 32. These adiabatic materials 74 are retained detachably on the inner side of the cylindrical portion 32 by a portion 34 projected into the inner side from the lower end portion of the cylindrical portion 32. The inner face of the adiabatic material 74 is lined with a carbon sleeve 75. Although an adiabatic 74' is placed even on the bottom portion 31, this is not retained on the inner side of the cylindrical portion 32.

A thermal radiator 76 arranged above a crucible 71 which is a carbon-made cylindrical body enlarged in diameter in an upward direction is retained detachably on the inner side of the cylindrical portion 32. The crucible 71 is supported through a dish 78 on a crucible supporting shaft 11 called a pedestal, but is not retained on the inner side of the cylindrical portion 32.

An ascending, falling and turning arm 21 rises and falls in a vertical direction along a post portion 20 and turns in a horizontal direction around a basic portion. Thus, a cylindrical portion 32 coupled to the tip end of the ascending, falling and turning arm 21 rises and falls, and moves pivotally onto both the sides of the predetermined position on the bottom portion 31. A guide sleeve 34 is mounted on the external face of the cylindrical portion 32. The guide sleeve 34 is engaged with a guide rod 13 projected onto the upper face of the floor bottom portion 10, so as to position the cylindrical portion 32 in a specified position on the bottom portion 31.

Figure 4:
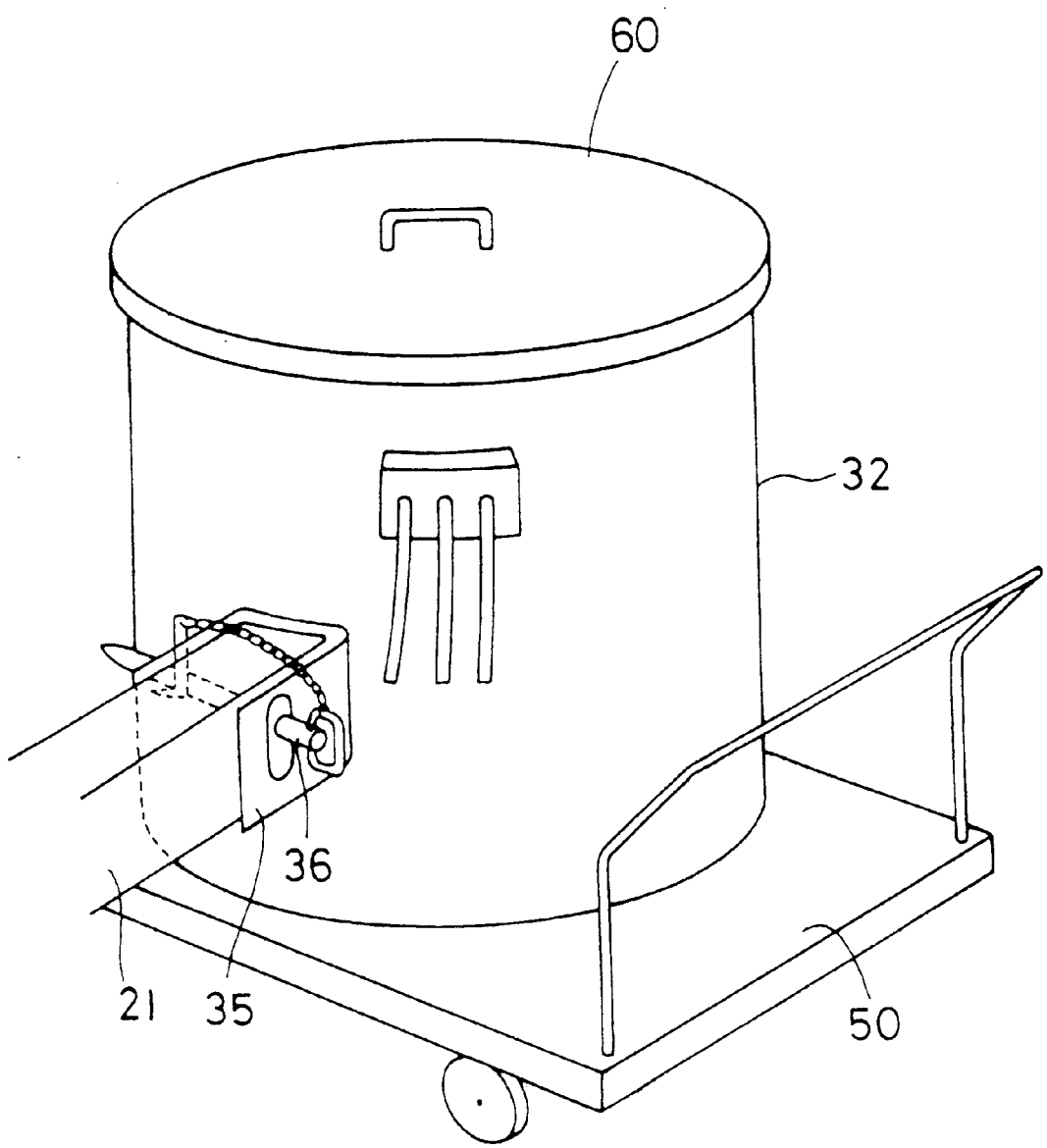
FIG. 4 is perspective view showing a apparatus major portion and a method of using it.

The tip end portion of the ascending, falling and turning arm 21 is engaged with the bracket 35 mounted on the external face of the cylindrical portion, 32 as shown in FIG. 4, so as to be coupled to the cylindrical portion 32 with a horizontal pin 36 inserted through the bracket 35. The cylindrical portion 32 can be coupled to and separated from the ascending, falling and turning arm 21 with one touch through the detaching operation of the pin 36.

The cover portion 33 of the main chamber 30 is placed concentrically on the cylindrical portion 32 and is sealed with respect to the cylindrical portion 32 with an O ring engaged with the external peripheral portion of the bottom face. In the central portion of the cover portion 33 is provided a circular opening portion 37.

A pull chamber 40 is placed on the central portion of the cover body 33 and the interior portion thereof is communicated within the main chamber 30 through the opening portion 37. The pull chamber 40 is coupled to the tip end of the ascending, falling and turning arm 22 projected forwards from the front face of the post portion 20. The ascending, falling and turning arm 22 rises and falls in a vertical direction along the post portion 20 as in the ascending, falling and turning arm 21, and turns in a horizontal direction around the basic portion. Therefore, the pull chamber 40 rises and falls, and moves pivotally onto both the sides of a specified position around the apparatus. Reference numeral 43 is a pulling up apparatus provided in the uppermost portion of the pull chamber 40.

A single crystal producing method using this apparatus will be described hereinafter.

A single crystal pulling up operation is conducted in a condition where a main chamber 30 and a pull chamber 40 are assembled, namely, a cylindrical portion 32 is placed on a bottom portion 31, a cover portion 33 is placed on it, and further, a pull chamber 40 is placed on it. A heater 72, an adiabatic material 74 and a thermal radiator 76, among the hot zone components 70, are retained on the inner side of the cylindrical portion 32. The heater terminal 73 and 73 are connected with power terminals 12 and 12, and a crucible 71 is retained, through a dish 78, on a crucible support shaft 11.

After the pulling up operation of the single crystals is over, a cooling operation of an apparatus is allowed to wait enough to overhaul the chamber, and the pull chamber 40 is raised. After the pivotal movement sideways of the specified position, the single crystals from within the pull chamber 40 are taken out. The cover portion 33 of the main chamber 30 is taken out. The cylindrical portion 32 is raised until the guide sleeve 34 is pulled through from the guide rod 13 with various hot zone components 70 retained within the cylindrical portion 32 remaining. After the pivotal movement sideways of the specified position, the cylindrical portion 32 is placed on a truck 50 placed alongside the apparatus. The ascending, falling and turning arm 21 is separated from the cylindrical portion 32. The cover 60 is engaged with and the cylindrical portion 32 is carried to another chamber different from the pulling up chamber by a truck 50.

In another chamber, hot zone components, namely, a heater 72, an adiabatic material 74 and a thermal radiator 76 are disengaged from the brought-in cylindrical portion 32. After the reproducing operation, these hot zone components 70 are assembled within the cylindrical portion 32. In addition, these hot zone components 70 are assembled within another cylindrical portion 32. In the pull up chamber, the cylindrical portion 32 is disengaged from, and then, a crucible 71 is exchanged. The cylindrical portion 32 which goes through the assembling operation of the hot zone components in advance in another chamber is carried into the pull up chamber. The brought-in cylindrical portion 32 is coupled to the ascending, falling arms 21 and are placed on the bottom portion 31 by the operation of the arm. A cover portion 33 is placed on the cylindrical portion 32 and the pull chamber 40 is placed, so as to start the next single crystal pulling up operation.

According to such a single crystal producing method, the overhauling, reproducing and assembling operations of the various hot zone components retained on the inner side of the cylindrical portion 32 are not conducted in the pulling up chamber. A cylindrical portion 32 who goes through an assembling operation in another chamber is used, thereby shortening the time required to the next pulling up start. Since the overhauling, reproducing and assembling operations of the hot zone components 70 retained on the inner side of the cylindrical portion 32 are not conducted within the pulling up chamber, the dust amount in the pulling up chamber is reduced. As a mechanism for ascending, falling and turning the cylindrical portion 32 is provided, the disengaging operation and the setting operation of the cylindrical portion 32 is easy to conduct. A concrete example of the required time contraction is shown in Table 1.

The overhauling, reproducing and assembling operations of the hot zone components retained on the inner side of the cylindrical portion are not conducted. Thus, the operation time is omitted and the apparatus is not required to be sufficiently cooled due to the operation omission, thereby shortening the cooling time. As a result, the time required to the next pulling up start time was 10 hours when the cylindrical portion 32 is raised. When the cylindrical portion 32 is carried to another chamber, the crucible 71, together with other hot zone components 70, is not necessary to engage and disengage the crucible 71 in the pulling up chamber. As a result, the dust is more constrained from being caused in the pulling up chamber.

Figure 5:
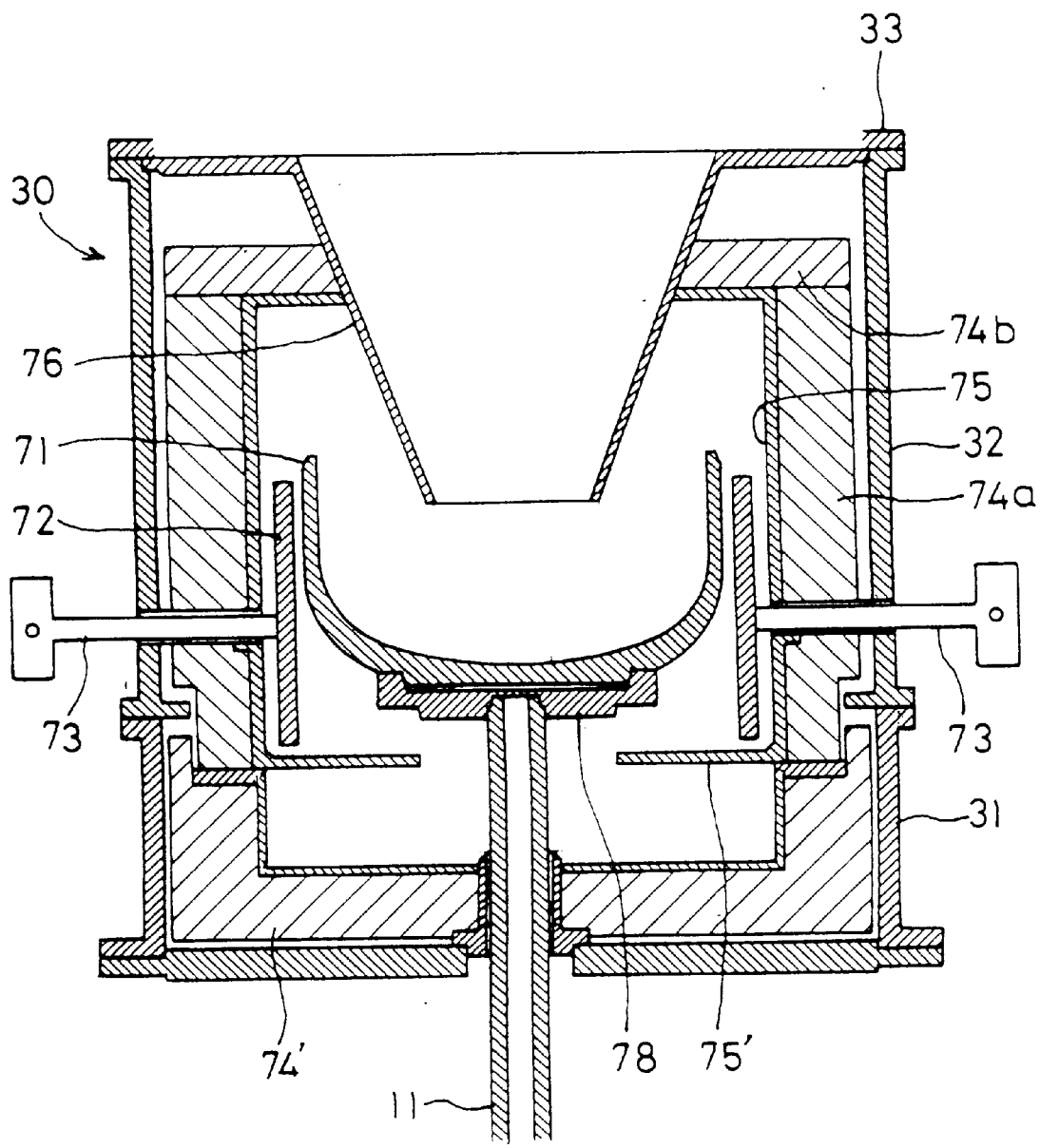
FIG. 5 is a longitudinally front view showing other inner configurations of a main chamber.

In FIG. 5, although the dish 78 and the crucible 71 are retained by the extending portion 75', the crucible 71 can be directly retained by the extending portion 75'.

Usability In Industry

As described above, in the single crystal producing apparatus of this invention, at least a cylindrical portion of the main chamber can be disengaged from an apparatus, so as to conduct the overhauling, reproducing and assembling operations of the hot zone components within cylindrical portion externally of the apparatus. Thus, time required to the next pulling up operation start can be considerably shortened, and the availability can be improved. Furthermore, dust amount within the pulling up chamber and the hot zone can be reduced. Therefore, through application to the producing of the silicon single crystals to be used in, for example, a semiconductor apparatus, the quality can be improved and the producing cost can be lowered.

According to the single crystal producing method of the invention, the overhauling, reproducing and assembling conventionally. Now the time is shortened to 6 hours or so. The dust amount per chamber becomes 1/100.

TABLE 1

|  | Conventional | Invented |
| --- | --- | --- |
| Body Cooling | 4 hours | 2 hours |
| Body Overhauling | 1 hour | 10 min. |
| Reproducing - Assembling | 1 hour | 10 min. |
| Raw Material | 1 hour | 1 hour |
| Vacuum Operation | 3 hours | 3 hours |
| Time Taken to Next Pulling Up | 10 hours | 6 hours and 10 minutes |

FIG. 5 shows a second embodiment of this invention. A single crystal producing apparatus according to the second embodiment is different in the configuration of the main chamber from the single crystal producing apparatus of the first embodiment.

This main chamber can retain a crucible 71 on the inner side of the cylindrical portion 32. Namely, the lower end portion of the carbon sleeve 75 which lines the inner face of the adiabatic material 54 is extended into the interior side and the dish 78 is retained by the extended portion 75'operations of the hot zone components within the cylindrical portion externally of the apparatus can be conducted with using the apparatus. Through application to the producing of the silicon single crystals to be used in, for example, a semiconductor apparatus, the quality can be improved and the producing cost can be lowered.

What is claimed is:

1. A single crystal producing apparatus, wherein single crystals by a CZ method are raised, a raw material molten liquid is produced by a hot zone placed within the main chamber, and the single crystals to be pulled up from the raw material molten liquid is brought in within a pull chamber coupled to the upper portion of the main chamber, comprising:

a cylindrical portion of the main chamber detachable from the apparatus; and at least one hot zone component retainable on the indoor side of the cylindrical portion.

2. A single crystal producing apparatus according to claim 1, further comprising:

a main chamber having a bottom portion, a cylindrical portion, and a cover portion sequentially stacked.

3. A single crystal producing apparatus according to claim 2, wherein hot zone components retainable on the inner side of the cylindrical portion are a heater arranged on the outside of a crucible, an adiabatic material arranged on the outside of the heater, and a thermal radiator arranged above the crucible.

4. A single crystal producing apparatus according to claim 2, wherein hot zone components retainable on the inner side of the cylindrical portion are a crucible, a heater arranged on the outside of the crucible, an adiabatic material arranged on the outside of a heater, and a thermal radiator arranged above the crucible.

5. A single crystal producing apparatus according to claim 2, wherein an ascending, falling turning drive mechanism for ascending, falling turning at least a cylindrical portion of the main chamber, and the cylindrical portion can be separated from the ascending, falling turning drive mechanism.

6. A single crystal producing apparatus according to claim 5, wherein the ascending, falling drive mechanism comprises a post portion provided near a chamber setting portion where a main chamber is set up, and an ascending, falling turning arm which ascends and falls along the post portion, turns in a horizontal direction around a basic portion, so as to detachably couple the top end portion to the cylindrical portion.

7. A single crystal producing apparatus according to claim 1, further comprising:
   hot zone components retainable on the inner side of the cylindrical portion, said hot zone components including a heater arranged on the outside of a crucible, an adiabatic material arranged on the outside of the heater, and a thermal radiator arranged above the crucible.

8. A single crystal producing apparatus according to claim 7, wherein the heater is connected with a power terminal outside of a main chamber with a heater terminal projecting outside thereof thorough the cylindrical portion.

9. A single crystal producing apparatus according to claim 8, wherein the heater terminal is a heater retaining member for retaining a heater within a cylindrical portion.

10. A single crystal producing apparatus according to claim 9, wherein an ascending, falling turning drive mechanism for ascending, falling turning at least a cylindrical portion of the main chamber, and the cylindrical portion can be separated from the ascending, falling turning drive mechanism.

11. A single crystal producing apparatus according to claim 8, wherein an ascending, falling turning drive mechanism for ascending, falling turning at least a cylindrical portion of the main chamber, and the cylindrical portion can be separated from the ascending, falling turning drive mechanism.

12. A single crystal producing apparatus according to claim 7, wherein an ascending, falling turning drive mechanism for ascending, falling turning at least a cylindrical portion of the main chamber, and the cylindrical portion can be separated from the ascending, falling turning drive mechanism.

13. A single crystal producing apparatus according to claim 1, further comprising:
   hot zone components retainable on the inner side of the cylindrical portion, said hot zone components including a crucible, a heater arranged on the outside of the crucible, an adiabatic material arranged on the outside of the heater, and a thermal radiator arranged above the crucible.

14. A single crystal producing apparatus according to claim 13, wherein a heater is connected with a power terminal outside of a main chamber with a heater terminal projecting outside thereof through the cylindrical portion.

15. A single crystal producing apparatus according to claim 13, wherein an ascending, falling turning drive mechanism for ascending, falling turning at least a cylindrical portion of the main chamber, and the cylindrical portion can be separated from the ascending, falling turning drive mechanism.

16. A single crystal producing apparatus according to claim 1, further comprising:
   an ascending, falling, and turning drive mechanism for ascending, falling, and turning at least the cylindrical portion of the main chamber, the cylindrical portion being separable from the ascending, falling, and turning drive mechanism.

17. A single crystal producing apparatus according to claim 16, wherein the ascending, falling, and turning drive mechanism comprises:
   a post portion provided near a chamber setting portion where a main chamber is set up, and
   an ascending, falling, and turning arm which ascends and falls along the post portion, and turns in a horizontal direction around a basic portion, so as to detachably couple the tip end portion to the cylindrical portion.

18. A single crystal producing apparatus according to claim 17, wherein the ascending, falling, and turning arm is configured to cause a pull chamber placed on the main chamber to ascend, fall, and turn, said ascending, falling and turning arm being provided on the post portion.

19. A single crystal producing method for using the single crystal producing apparatus according to claim 1, comprising the steps of:
   disengaging the cylindrical portion of the main chamber from the apparatus after the raising operation of the single crystals,
   carrying the cylindrical portion externally of the apparatus,
   conducting outside of the apparatus the overhauling, cleaning, and assembling operations of the hot zone components retained on the inner side of the cylindrical portion, and
   mounting on the apparatus another cylindrical portion which goes through the overhauling, cleaning, and assembling operations of the hot zone components outside of the apparatus, so as to start the next single crystal raising operation.

20. A single crystal producing method according to claim 19 further comprising a step of:
   separating the outside of the apparatus from a pulling up chamber where the apparatus is set up to form another chamber.

* * * * *